(12) United States Patent
Yamada

(10) Patent No.: US 7,760,022 B2
(45) Date of Patent: Jul. 20, 2010

(54) AMPLIFIER CIRCUIT

(75) Inventor: Koichi Yamada, Kanagawa (JP)

(73) Assignee: Tektronix International Sales GmbH, Rheinfall (CH)

( * ) Notice: Subject to any disclaimer, the term of this patent is extended or adjusted under 35 U.S.C. 154(b) by 0 days.

(21) Appl. No.: 12/403,368

(22) Filed: Mar. 12, 2009

(65) Prior Publication Data

US 2009/0231033 A1    Sep. 17, 2009

(30) Foreign Application Priority Data

Mar. 12, 2008    (JP)    ............... 2008-063225

(51) Int. Cl.
  *H03F 3/45*    (2006.01)
(52) U.S. Cl. ..................... 330/255; 330/263
(58) Field of Classification Search ............ 330/255, 330/262, 263–265, 269
  See application file for complete search history.

(56) References Cited

U.S. PATENT DOCUMENTS

| 4,356,452 A | 10/1982 | Iwamatsu |
| 6,646,508 B1 * | 11/2003 | Barbetta .................. 330/264 |
| 6,741,133 B2 * | 5/2004 | Kinsho et al. ............. 330/263 |

* cited by examiner

*Primary Examiner*—Khanh V Nguyen
(74) *Attorney, Agent, or Firm*—William K. Bucher

(57) ABSTRACT

Power consumption of current sources in an amplifier circuit is reduced even during amplifier operation while keeping linearity of an output signal. The amplifier circuit is suitable for use in a signal generator that provides an output signal previously set by a user and having a known level. Positive and negative current sources receive an input voltage Vi depending on an output voltage Vo. An output resistor derives the output voltage Vo from currents provided by the positive and negative current sources. A variable bias generation circuit produces positive and negative bias voltages applied to the positive and negative current sources wherein the positive and negative bias voltages are set while the linearity of the output voltage is maintains using the known output level information.

6 Claims, 12 Drawing Sheets

AMPLIFIER CIRCUIT

TECHNICAL FIELD

The present invention relates generally to amplifier circuits and more particularly to an amplifier circuit having a variable dynamic range according to the output level of the amplifier providing an output signal having a predetermined level previously set by a user, especially, an amplifier circuit of which dynamic range is variable according to the output level.

BACKGROUND OF THE INVENTION

A signal generator provides an electronic signal having a desired level corresponding to a waveform data that is previously set by a user. The electronic signal is generally an analog signal provided to circuits or instruments under test for calibrating and/or testing the operational parameters of the circuit or the instrument.

FIG. 1 is a block diagram of an example of an output amplifier circuit 52 usable in a signal generator. Positive and negative current sources 60 and 62 generate positive and negative currents according to an input voltage Vi. The difference between the currents is provided to a 50 ohm termination (output) resistor R50 that converts the current to an output voltage Vo. Relatively large voltage sources, such as ±32V, are used for the current sources 60 and 62 to provide the positive and negative currents to generate the output voltage Vo having a dynamic range of ±10V at the 50 ohm termination.

High speed operational amplifiers U110 and U210 are used for driving of transistors Q110 and Q210 in response to the input signal. Most of high speed operational amplifiers have a power voltage range around ±5V. The operational amplifiers U110 and U210 use the power voltages ±5V from ±27V, that is, from ±32 V to ±22 V respectively. Because the input voltage Vi is around 0V, the level must be shifted to around the power voltages of the operational amplifiers U110 and U210. Therefore, positive and negative voltage to current converters 64 and 66 are used to produce varying currents depending on the input voltage Vi. The positive and negative voltages to current converters 64 and 66 are coupled to positive and negative bias voltages via resistors R100 and R200. The bias voltages are fixed to achieve the maximum dynamic range of the amplifier circuit.

The positive current source 64 has an operational amplifier U100 having its non-inverting input coupled to a reference ground. Junction J11 is virtually grounded due to the negative feedback of the operational amplifier U100. The current into the inverting input of the operational amplifier U100 is the result of current I101 flowing in a resistor R101 in response to the input voltage Vi and current I100 flowing in a resistor R100 in response to the positive bias voltage. Because of the operational amplifier U100, the currents I100 and I101 also follow in a resistor R102, which produces the voltage of a junction J12. The voltage at the junction J12 and resistance values of resistors R102 and R103 set the emitter current of the transistor Q100 as well as the current flowing in R111 since the collector current of Q 100 is almost the same as the emitter current. The voltage at junction J13 is fixed at +27V as a result of the non-inverting input of operational amplifier U110 being coupled to a +27V source. Current changes in the output of the positive current source 60 are the result of voltage changes at junction J14 caused by changes in the current through resistor R111 in response to the input voltage Vi. The negative current source 62 works in a similar manner with current changes in the output of the negative source 62 being the result of voltage changes at junction J24 caused by changes in the current through resistor R211 in response to the input voltage Vi.

The described amplifier circuit is an A class amplifier and consumes a large amount of power due to the large currents flowing through the transistors Q110 and Q210 even though the output voltage is small. This leads to high heat generation that is not preferable for stable operation of the circuit and accelerates degradation of the components.

SUMMARY OF THE INVENTION

An amplifier circuit according to the present invention is suitable for use in a signal generator or the like in which the output of the amplifier circuit is previously set and the output level is known. Then, the present invention makes it possible to change the upper and lower limits of the amplifier circuit dynamic range independently from each other and reduce the power consumption and maintain linearity using the output level information.

The amplifier circuit according to the present invention has positive and negative current sources respectively receiving first and second current inputs and generating respective current outputs. A current to voltage converter generates an output voltage from the respective current outputs provided by the positive and negative current sources. A bias generator produces first and second bias voltages set according to a desired level for optimum dynamic range and amplifier linearity. The first bias voltage is provided to a first current to voltage converter that produces a first output voltage inverted from the first bias voltage and the second bias voltage is provided to a second current to voltage converter that produces a second output voltage inverted from the second bias voltage. A first voltage to current converter receives the first inverted output voltage and an input voltage and produces a first current output representative of the first bias voltage and the input voltage, and a second voltage to current converter receives the second inverted output voltage and the input voltage and produces a second current output representative of the second bias voltage and the input voltage, wherein the first current output of the first voltage to current converter is provided to the positive current source as the first current input and the second current output from the second voltage to current converter is provided to the negative current source as the second current input.

The bias generator may receive a center value offset voltage for varying the first and second bias voltages in response to the center values offset voltage to generate a corresponding center value offset voltage for the output voltage. The bias generator may also dynamically change the first and second bias voltages as a function of the peak to peak voltage range of the output voltage and information of the voltage level variation of the output voltage.

The amplifier circuit further has a transimpedance amplifier that may receive the center value offset voltage and provides a current output coupled to the first and second current to voltage converters for varying the first and second current outputs of the respective first and second voltage to current converters to generate a center value offset voltage for the output voltage corresponding to the center value offset voltage. The amplifier circuit may have a current to voltage converter receiving the current outputs of the positive and negative current sources with the current to voltage converter generating an error correction voltage in response to the center value offset voltage of the output voltage not corresponding with the center value offset voltage provided to the amplifier circuit.

The amplifier circuit may further have a temperature detector for the positive and negative current sources that generates an output voltage in response to a detected temperature over a predetermined value and applies the output voltage to the bias generator for changing the first and second bias voltages to reduce the current outputs flowing in the positive and negative current sources.

The objects, advantages and other novel features of the present invention are apparent from the following detailed description when read in conjunction with the appended claims and attached drawings.

DETAILED DESCRIPTION OF THE INVENTION

Figure 2:
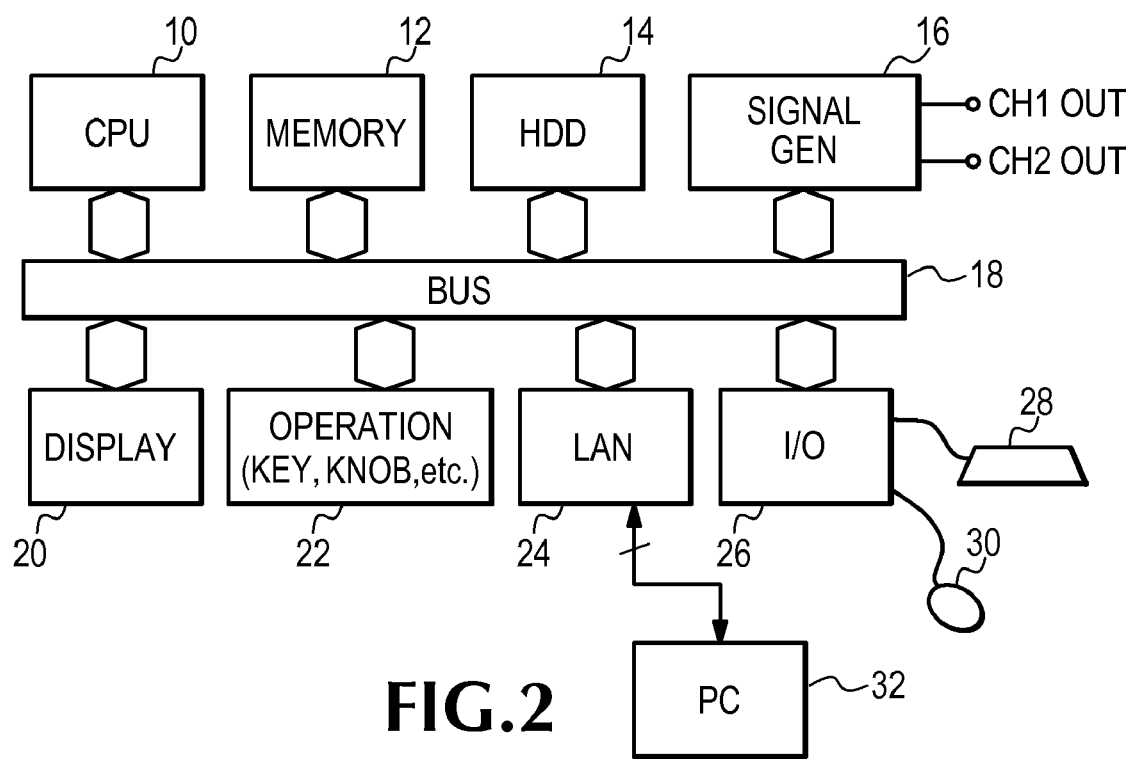
FIG. 2 is a block diagram of a signal generator.

Referring to FIG. 2, there is shown a representative block diagram of a signal generator, such as the AWG7102 signal generator manufactured and sold by Tektronix, Inc., Beaverton, Oreg., that uses the amplifier circuit according to the present invention. The signal generator has a central processing unit (CPU) 10 that controls the operation of the instrument according to programs stored on a hard disk drive (HDD) 14. A memory 12, such as RAM memory, is used for a work area for the CPU 10 to read programs from HDD 14. A user can set up the signal generator to generate an output test signal via an operation panel 22 including buttons, knobs and the like on the front panel of the instrument. A display device 20 displays a user interface for setting various parameters for the output test signal and visualizing the output test signal as a function of the parameter settings.

A waveform generation circuit 16 generates the output test signal based on user defined parameters. In this example, the waveform generation circuit 16 has two channel outputs. An input/output port 26 is used for connecting an external keyboard 34, a pointing device, such as a mouse 36, and the like to the signal generator. The external keyboard 28 and/or mouse 30 may be included as part of the front panel controls of the signal generator for setting parameters. The blocks are coupled together via a signal and data bus 18. The bus 18 of the signal generator may have a Local Area Network (LAN) interface 24 for connecting the signal generator to an external controller, such as a personal computer (PC) 32 or other testing instruments. The LAN interface 24 allows the user interface to operate on the PC 32 and pass output signal data to the signal generator and also enables the PC 32 to control the signal generator over a network.

Figure 3:
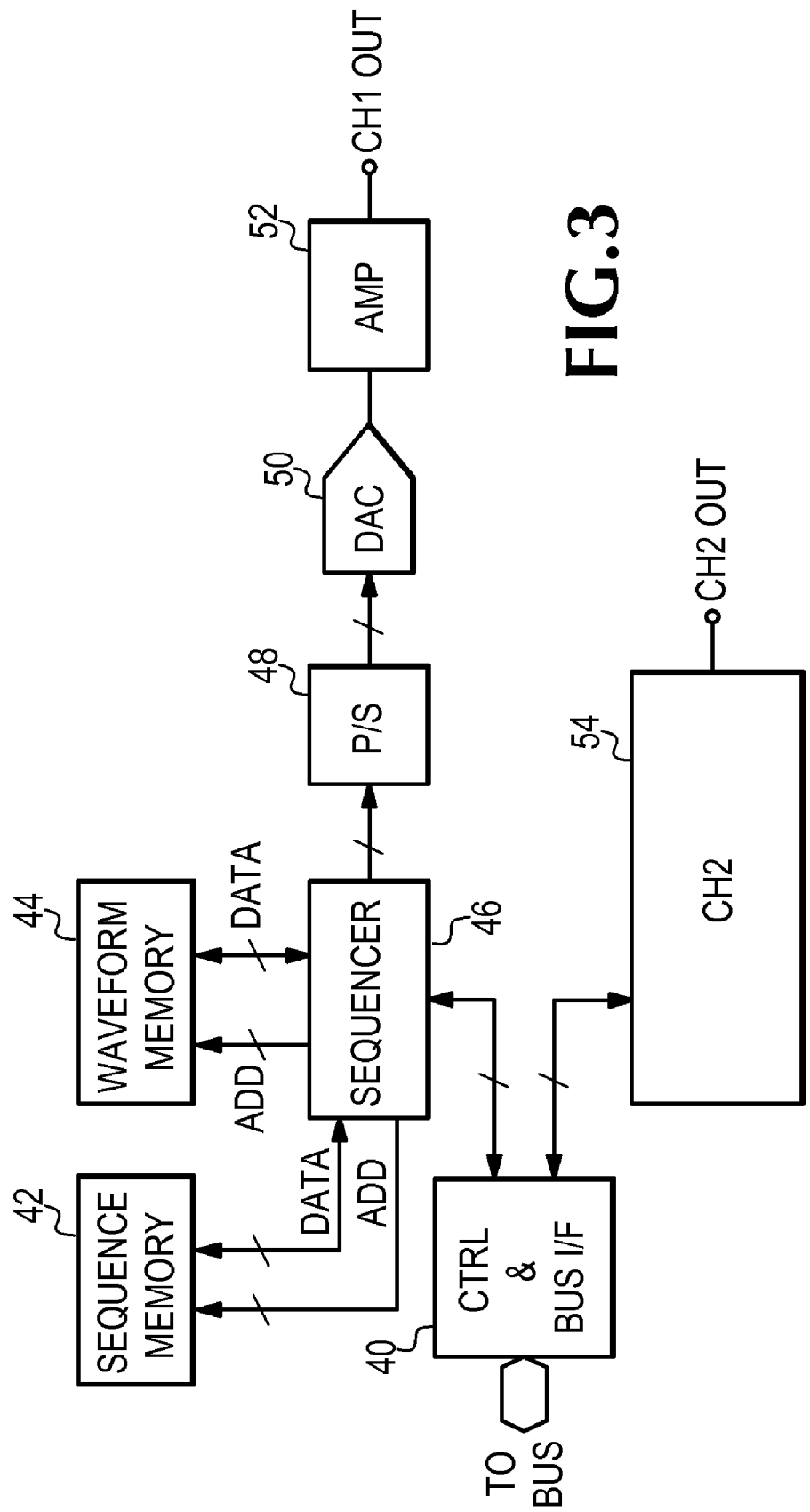
FIG. 3 is a block diagram of an example of a signal generation circuit.

FIG. 3 is a block diagram of the signal generation circuit 16. The first and second channels have the same configuration so only the first channel is shown in detail. A sequencer 46 has address counters (not shown) to access sequence memory 42 and waveform memory 44. A sequence order of signal patterns set by user is stored in the sequence memory 42 via the sequencer 46. The sequencer 46 provides addresses to the waveform memory 44 according to the sequence order from the sequence memory 42 to read and output waveform data that is provided to a parallel to serial converter 48. The parallel to serial conversion accelerates the data transfer rate by reducing the bit width. This is because the data read speed from the memory 44 is slow. A digital to analog converter (DAC) 50 converts the output data of the parallel to serial converter 48 to an analog signal that is amplified by an amplifier circuit 52 to provide it as an output of the first channel. In actual practice, multiple parallel to serial converters are coupled to the input of the digital to analog converter with the sequencer receiving the sequence memory data and providing the address data to multiple waveform memories and receiving the waveform data from the respective waveform memories and providing the respective waveform data to one of the multiple parallel to serial converters. A control and bus interface circuit 40 controls the channels and the data exchange with the bus 18. Then, the signal generation circuit 16 operates under control of the CPU 10.

Figure 1:
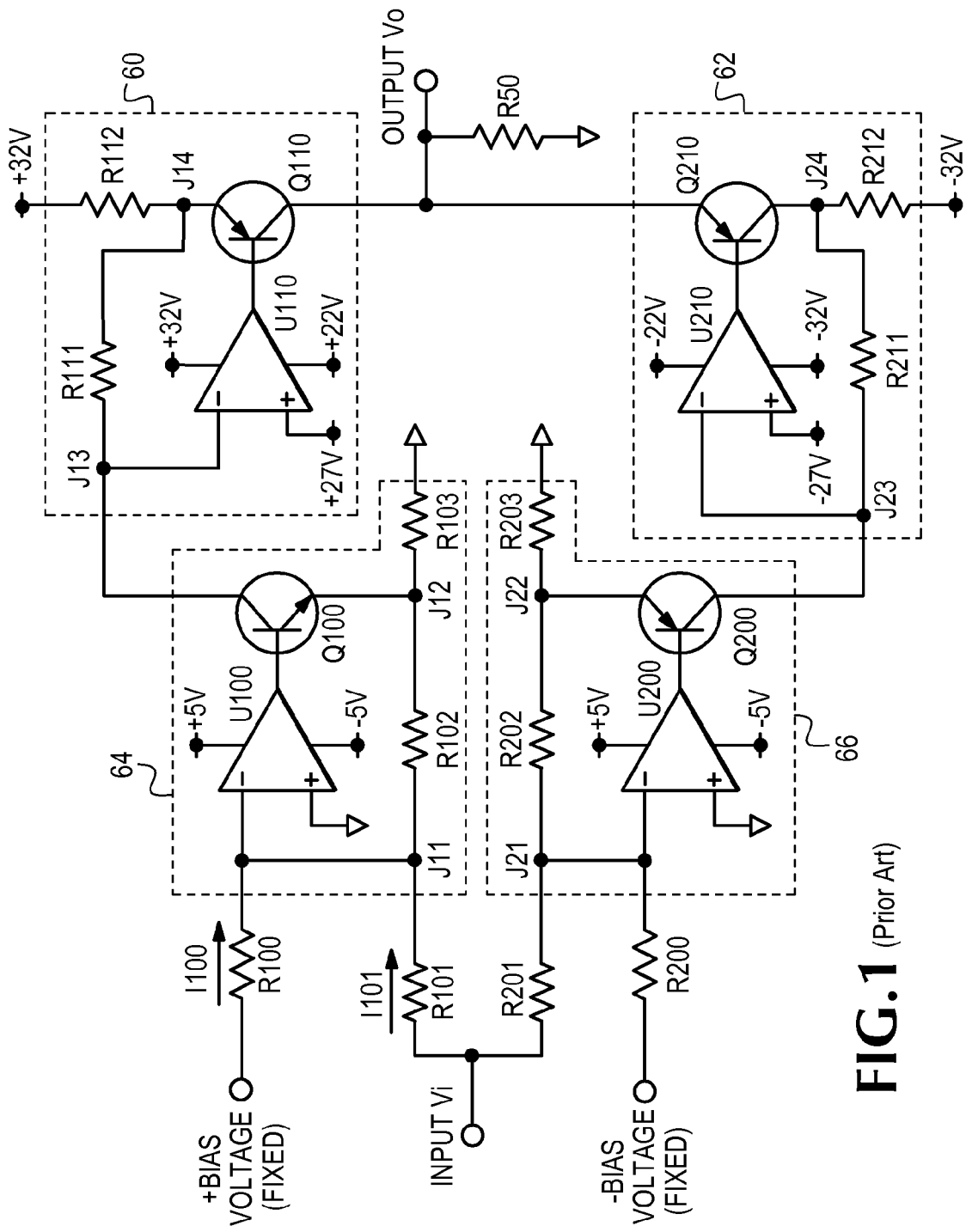
FIG. 1 is a block diagram of an example of a conventional amplifier circuit.
Figure 4:
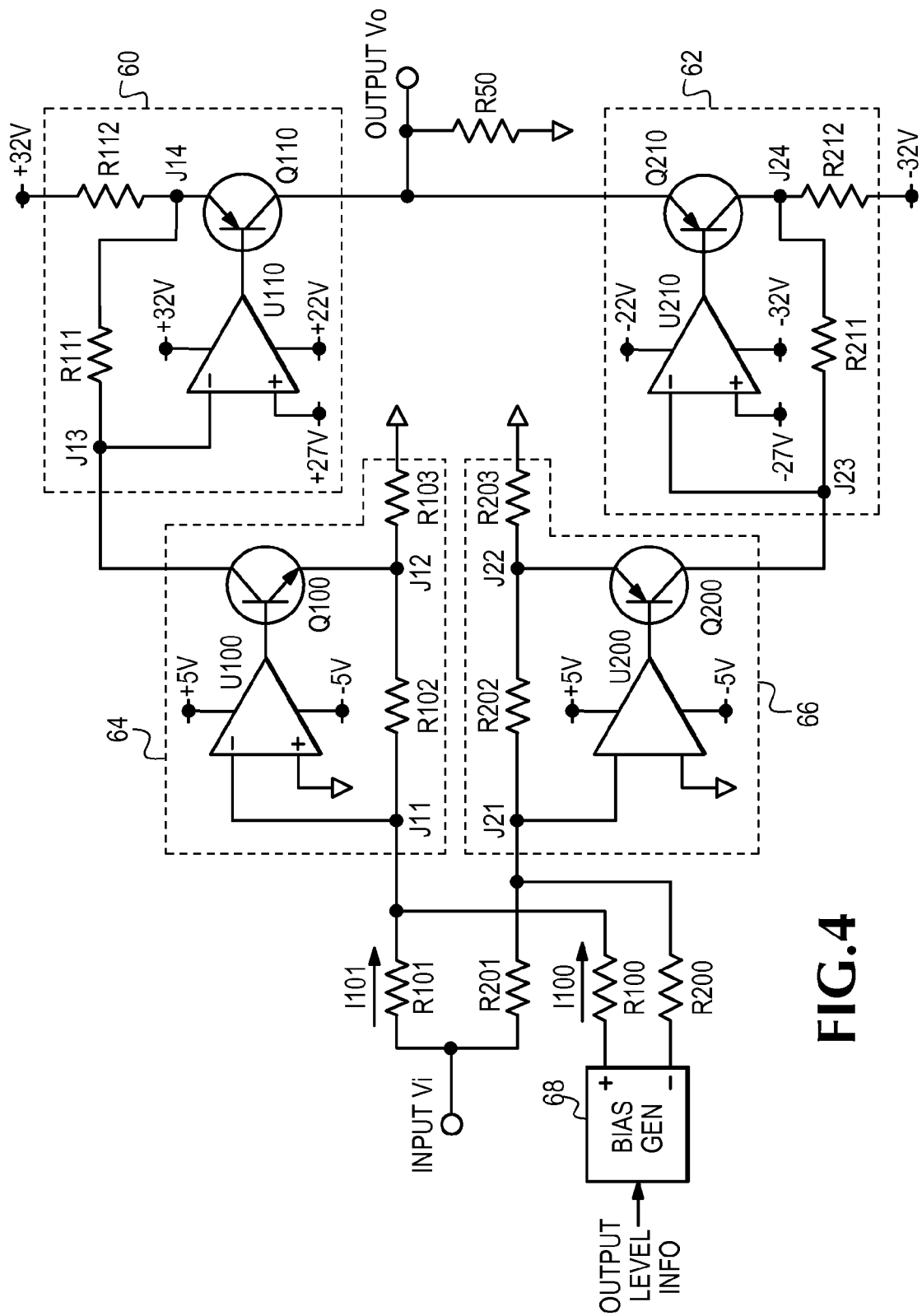
FIG. 4 is a block diagram of an embodiment of an amplifier circuit according to the present invention.

FIG. 4 is a block diagram of a first embodiment of an amplifier circuit according to the present invention. The amplifier circuit of the present invention is suitable for use in a signal generator, such as the amplifier circuit 52 shown in FIG. 3. Various blocks and components in FIG. 4 are labeled the same as corresponding blocks and components labeled in FIG. 1. The amplifier circuit of FIG. 4 is provided with a bias generation circuit 68 that may include digital to analog converters (not shown). The bias generation circuit 68 provides variable positive and negative biases under control of the CPU 10 that uses level information on an output voltage produced in the signal generation circuit 16. For simplicity, FIG. 4 shows the bias generation circuit 68 receiving the level information though in the actual implementation CPU 10 processes the level information. The bias generation circuit 68 applies the bias voltages to the resistors R100 and R200. For the positive current source, 64, the junction J11 is virtually grounded and the current I100 depending on the voltage applied to the resistor R100 by the bias generation circuit 68 is provided to the junction J11. Then, the currents I100 and I101 flowing in the resistor R102 decides the voltage of the junction J12. If the voltage of the junction J12 becomes higher the current flowing in the resistor R111 increases and the voltage of the junction J14 increases to reduce the current flowing in the resistor R112. Operation of the negative side is similar.

Figure 5A:
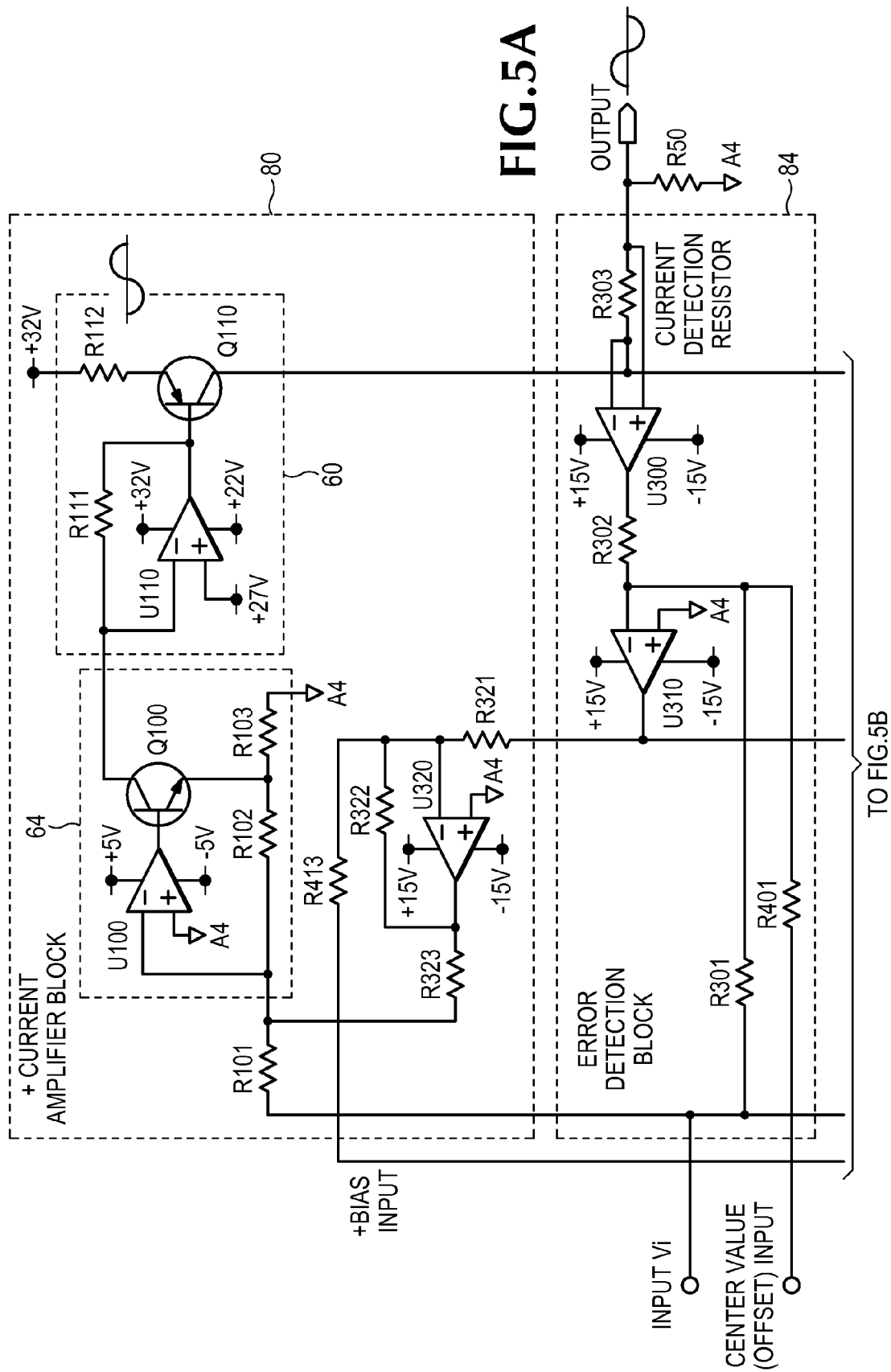
FIGS. 5A and 5B are detailed block diagrams of an embodiment of an amplifier circuit according to the present invention.
Figure 5B:
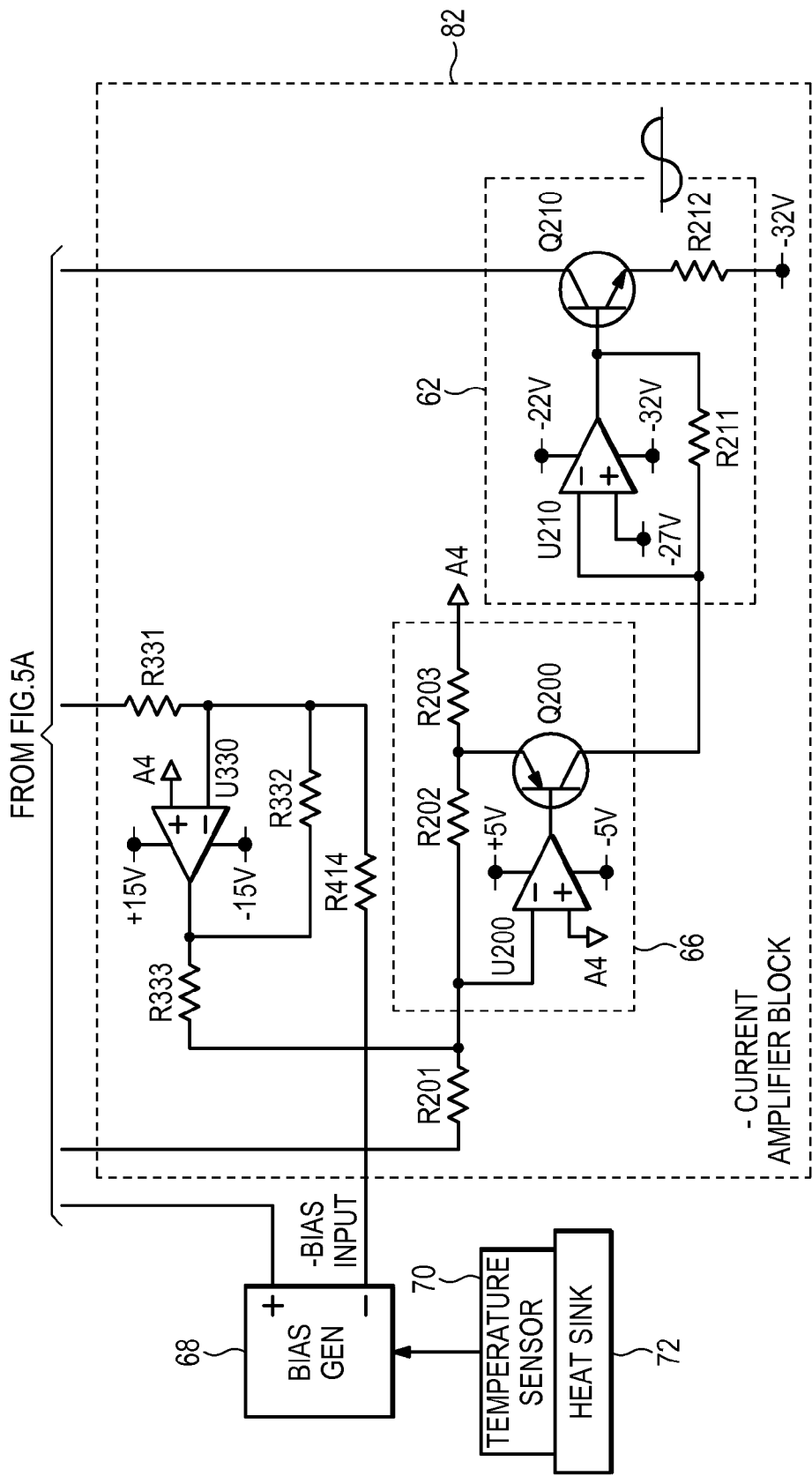

FIGS. 5A and 5B are a more specific embodiment of the amplifier circuit according to the present invention. The bias generation circuit 68 provides positive and negative bias voltages to respective operational amplifiers U320 and U 330. The non-inverting inputs of U320 and U330 are coupled to reference ground resulting in the respective inverting input being at virtual ground. The respective positive and negative bias voltages are coupled to the respective virtual grounds of U320 and U330 and respective negative feedback resistors R322 and R332. The respective negative feedback resistors R322 and R332 are coupled to the respective outputs of U320 and U330. The positive bias voltage generates a current through resistor R413 to the virtually grounded of U320. The current at the inverting input of U320 flows through negative feedback resistor R322 resulting in the output of U320 going negative. The negative going output of U320 draws current through voltage divider resistors R102 and R103 of voltage to current converter 64. Conversely, the negative bias voltage generates a current through resistor R414 to the virtually grounded of U330. The current at the inverting input of U330 flows through negative feedback resistor R332 resulting in the output of U330 going positive. The positive going output of U330 draws current through voltage divider resistors R202 and R203 of voltage to current converter 66.

The current flowing through R102 and R103 produces a negative voltage at the junction of R102 and R103. The negative voltage is coupled to the emitter of Q100 of the voltage to current converter 64. Q100 is biased into conduction by the negative voltage with the collector current being close to the emitter current. The collector current flowing into Q100 is coupled to the negative feedback resistor R111 of operational amplifier U110 in the current source 60. The operational amplifier U110 has a virtual inventing input at +27V and a non-inverting input coupled to a positive voltage source of +27V. The negative feedback resistor R111 is coupled to the output of operational amplifier U110. The collector current flowing through the negative feedback resistor R111 produces a positive going voltage at the output of U110 which is coupled to the base of Q110 in the voltage converter 60. Increasing the positive voltage on the base of Q110 decreases the current output of Q110. Similarly, the current flowing through R202 and R203 produces a positive voltage at the junction of R202 and R203. The positive voltage is coupled to the emitter of Q200 of the voltage to current converter 64. Q200 is biased into conduction by the positive voltage with the collector current being close to the emitter current. The collector current flowing out of Q200 is coupled to the negative feedback resistor R211 of operational amplifier U210 in the current source 62. The operational amplifier U210 has a virtual inventing input at −27V and a non-inverting input coupled to a negative voltage source of −27V. The negative feedback resistor R211 is coupled to the output of operational amplifier U210. The collector current flowing through the negative feedback resistor R211 produces a negative going voltage at the output of U210 which is coupled to the base of Q210 in the current amplifier 62. Increasing the negative voltage on the base of Q110 decreases the current output of Q210.

An input voltage Vi, such as a sine wave from the digital to analog converter (DAC) 50, is respectively applied to resistors R101 and R201. The rising portion of the sine wave increases the current flowing through R101 resulting in a decrease in the negative bias on the emitter of Q100. The decreased negative bias on Q100 decreases the collector current that is provided to negative feedback resistor R111 of U110. A decrease in the current flowing through negative feedback resistor R111 results in a decrease in the positive voltage on the base of Q110, which increases the current flowing through Q110. The rising portion of the sine wave increases the current flowing through R201 resulting in increases the positive bias on the emitter of Q200. The increased positive bias on Q200 increases collector current that is provided to negative feedback resistor R211 of U210. An increase in the current flowing through negative feedback resistor R211 results in an increase in the negative voltage on the base of Q210, which decreases the current flowing through Q210. The falling portion of the sine wave increases the negative bias on the emitter of Q100 resulting in an increase in the collector current provided to negative feedback resistor R111 of U110. An increase in the current flowing through negative feedback resistor R111 results in an increase in the positive voltage on the base of Q110, which decreases the current flowing through Q110. The falling portion of the sine wave decreases the positive bias on the emitter of Q200 resulting in a decrease in the collector current provided to negative feedback resistor R211 of U210. A decrease in the current flowing through negative feedback resistor R211 results in a decrease in the negative voltage on the base of Q210, which increases the current flowing through Q210.

The amplifier circuit receives a center value of the peak to peak of the output voltage Vo in addition to the input voltage Vi that is coupled to the virtual ground inverting input of U310 in an error detection block 84. The center value may be an offset voltage applied to the output signal and preset by the user. For example, if the voltage of the center value is +3V then output voltage Vo is positively offset by +3V. The +3V center value or offset voltage is applied to the inverting virtual ground input of U310 resulting in current flowing through R401 toward the inverting input of U310. Since the inverting input of U310 does not receive current, the current through R401 passes through R301 and then through R101 and R201. The current through R101 and into the output of U320 reduces the negative bias on the emitter of Q100 which results in less current through Q100. Less current through Q100 causes less current to flow through negative feedback resistor R111 that results in less positive base voltage on Q110 which causes more positive current flow from the current source 60. The current through R201 and into the output of U330 increases the positive bias on the emitter of Q200 which results in more current through Q200. More current through Q200 causes more current to flow through negative feedback resistor R211 that results in more negative base voltage on Q210 which causes less negative current flow from the current source 62. Increased current flow from the positive current source 60 and less negative current flow from negative current source 62 produces more current flow into the termination resistor R50 causing a positive offset voltage of +3V.

The current outputs of Q110 and Q210 are coupled to the output termination resistor R50 via a current detection resistor R303 in error detection block 84. The output termination resistor side of R303 is coupled to the non-inverting input of U300 and the current receiving side of R303 is coupled to the inverting input of U300. U300 functions as a current to voltage converter where the input voltage on the inverting input is inverted at the output. As an example, if the output voltage should be zero but has a positive voltage, then there is an error. The current detection resistor R303 provides a positive voltage to the inverting input of U300 which results in a negative voltage at the output. The output of U300 is coupled through resistor R302 to the inverting input of U310 where the inverting input is at virtual ground. The negative voltage on the output of U300 causes a current to flow through R302 to the negative voltage at the output of U300. U310 has negative feedback loops where one negative feedback loop has resistors R301, R101, R323, R322 and R321, and the other feedback loop has resistors R 301, R201, R333, R332 and R331. Since the inverting input of U310 is at virtual ground, the current flowing through R302 is provided by the feedback loops of U310. Current flowing through R301 into R302 reduces the currents flowing through R101 and R201 which results in lower output voltage Vo. Note that the center value, that is the difference between the peak to peak voltages of the output voltage Vo, and the inverting input of U310 are both zero volts in this example.

Figure 6:
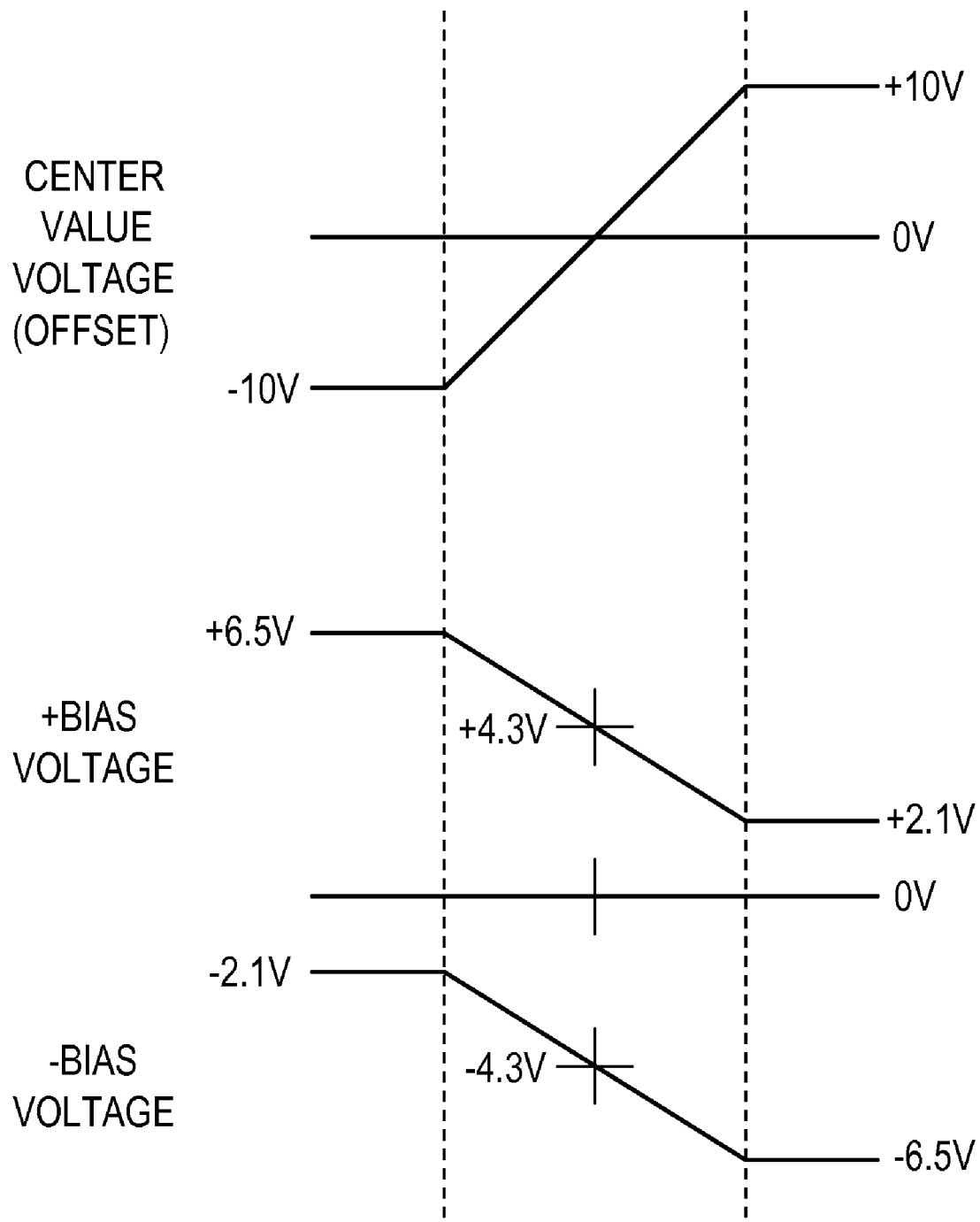
FIG. 6 is an example of a chart showing relationship of changes between a center value and positive and negative bias voltages.

The center value offset voltage may also be provided to the bias generation circuit 68 that produces the bias voltages provided to positive and negative current amplifier blocks 80 and 82. The center value offset voltage is then used as the output level information for the bias generator circuit 68. FIG. 6 illustrates how the positive and negative bias inputs can be varied to provide center value offsets to the output voltage Vo of the amplifier circuit.

FIG. 6 is a chart showing relationship between variations of the center value offset voltage and the positive and negative bias voltages of the bias generation circuit. FIG. 6 shows that the lower the center value offset voltage is the higher the positive and negative bias voltages shift and vice versa. If the center value is offset from zero volts by −3V, the positive bias voltage becomes more positive and the negative bias voltage becomes less negative. This results in less positive output current from the positive current source 60 and more negative output current from the negative current source 62. The current through the output termination resistor R50 is then being drawn into the negative current source 62. If the center value is offset from zero volts by +3V, the positive bias voltage becomes less positive and the negative bias voltage becomes more negative. These result in more positive output current from the positive current source 60 and less negative output current from the negative current source 62. The current through the output termination resistor R50 is then being drawn into the positive current source 62.

Figure 7:
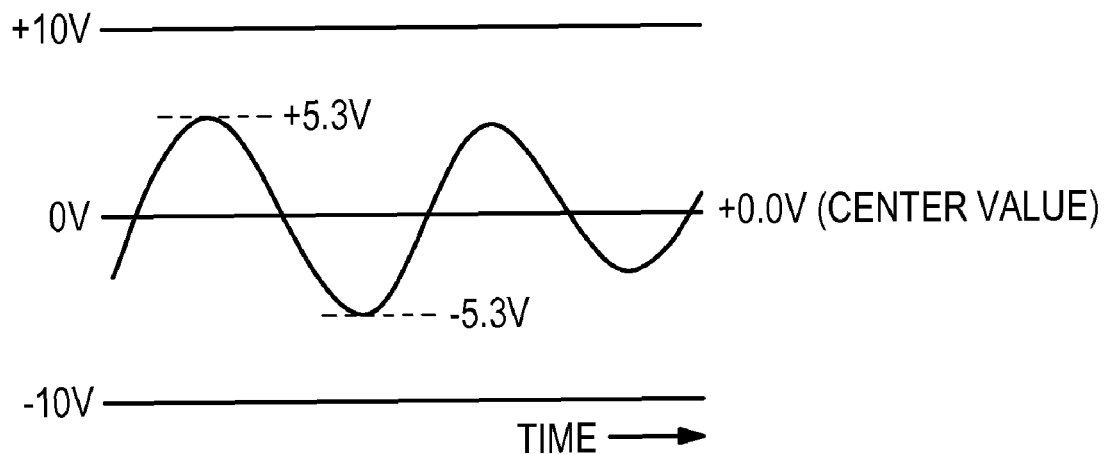
FIG. 7 shows an example of an output signal waveform of which center value is 0V and peak to peak voltage is +5.3V and −5.3V.
Figure 8:
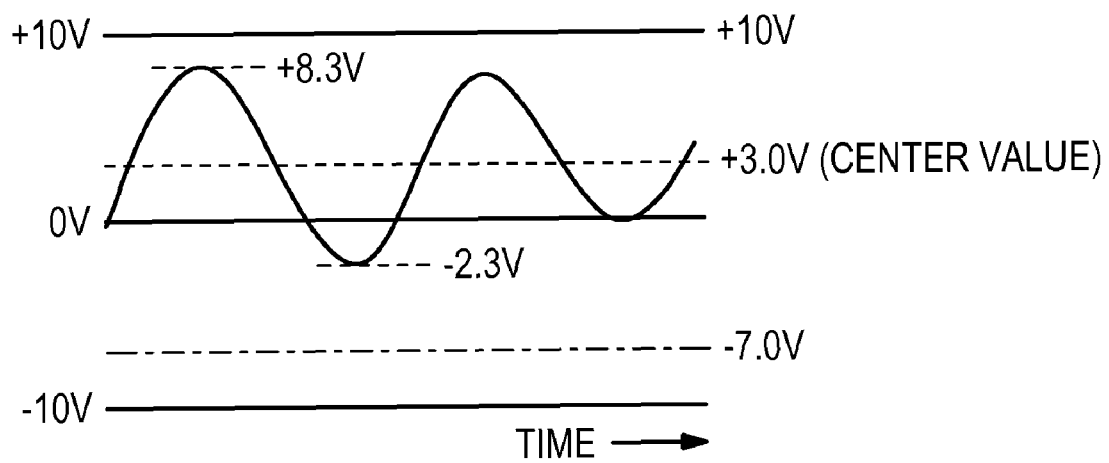
FIG. 8 shows another example of an output signal waveform in which center value is 3V.

FIG. 7 shows an example of an output signal waveform having a center value of 0V and peak to peak voltage of ±5.3V. The positive and negative bias voltages may be respectively set at +4.3V and −4.3V, as shown in FIG. 6, and the dynamic range is at the widest range in this embodiment at +10V to −10V. FIG. 8 shows another example of an output signal waveform of which center value is +3V, which is offset by +3V relative to the output signal shown in FIG. 7. The dynamic range of the amplifier circuit is from +10V to −7V that is narrower than that shown in FIG. 7. The current flowing in the negative current source 62 has decreased and the power consumption is reduced.

Figure 9:
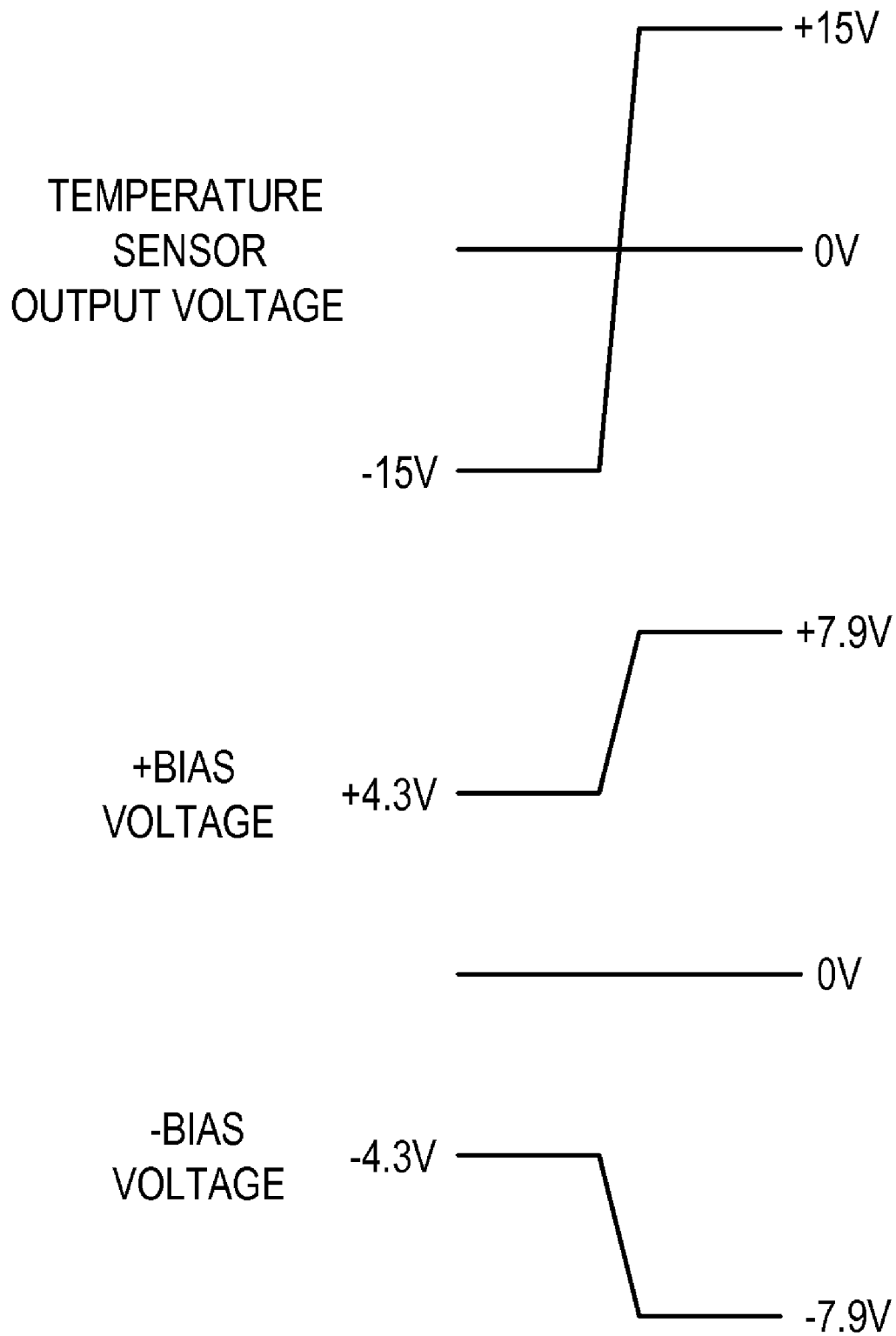
FIG. 9 is an example of a chart showing relationship between an output of a temperature sensor and changes in the positive and negative biases.

A temperature sensor 70 shown in FIG. 5B may be attached to a heat sink for heat-generating components such as the transistor Q110, Q210, etc. for detecting the generation of heat in the amplifier circuit. FIG. 9 is a chart showing an example of the relationship between an output voltage of the temperature sensor 70 and variation of the positive and negative bias voltages. The temperature sensor 70 usually provides −15V but if the temperature of the heat sink 72 increases and reaches to a predetermined value it provides +15V to the bias generation circuit 68. When the bias generation circuit 68 receives +15V from the temperature sensor 70, it increases the absolute values of the positive and negative bias voltages to reduce the currents provided to the positive and negative current sources 60 and 62.

In the embodiment shown in FIG. 9, the temperature sensor 70 has only the two output voltages +15V and −15V. However, the temperature sensor 70 may be provided with more levels of temperature detection producing corresponding voltages. Further, different positive and negative bias voltages may be provided corresponding to the plurality of the voltages. Additionally, the different positive and negative bias voltages may be set in correspondence with both the center value voltage and the temperature sensor output voltage. This may reduce the currents flowing in the current sources while keeping the linearity of the output voltage.

Figure 10A:
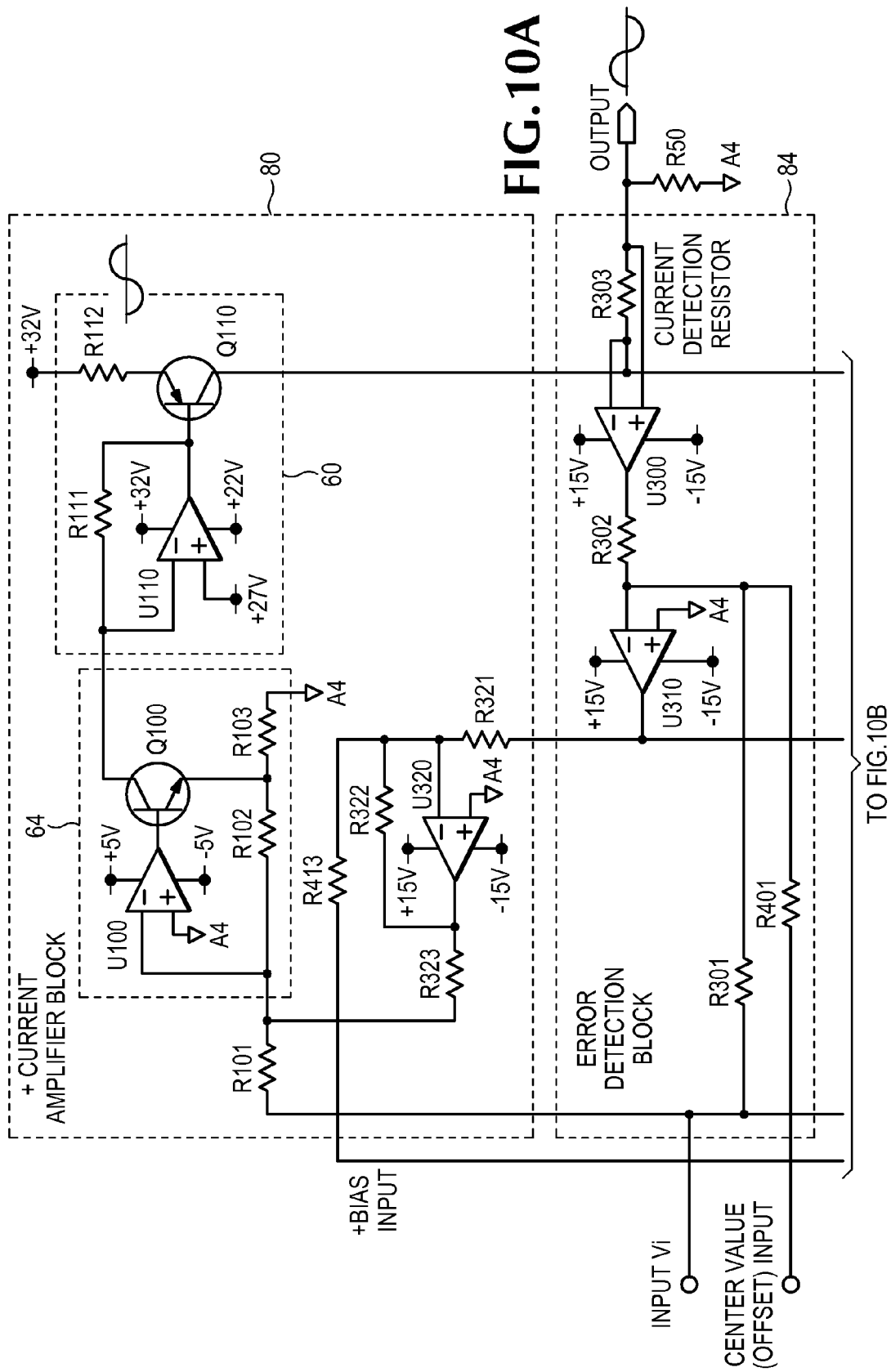
FIGS. 10A and 10B are block diagrams of another embodiment according to the present invention.
Figure 10B:
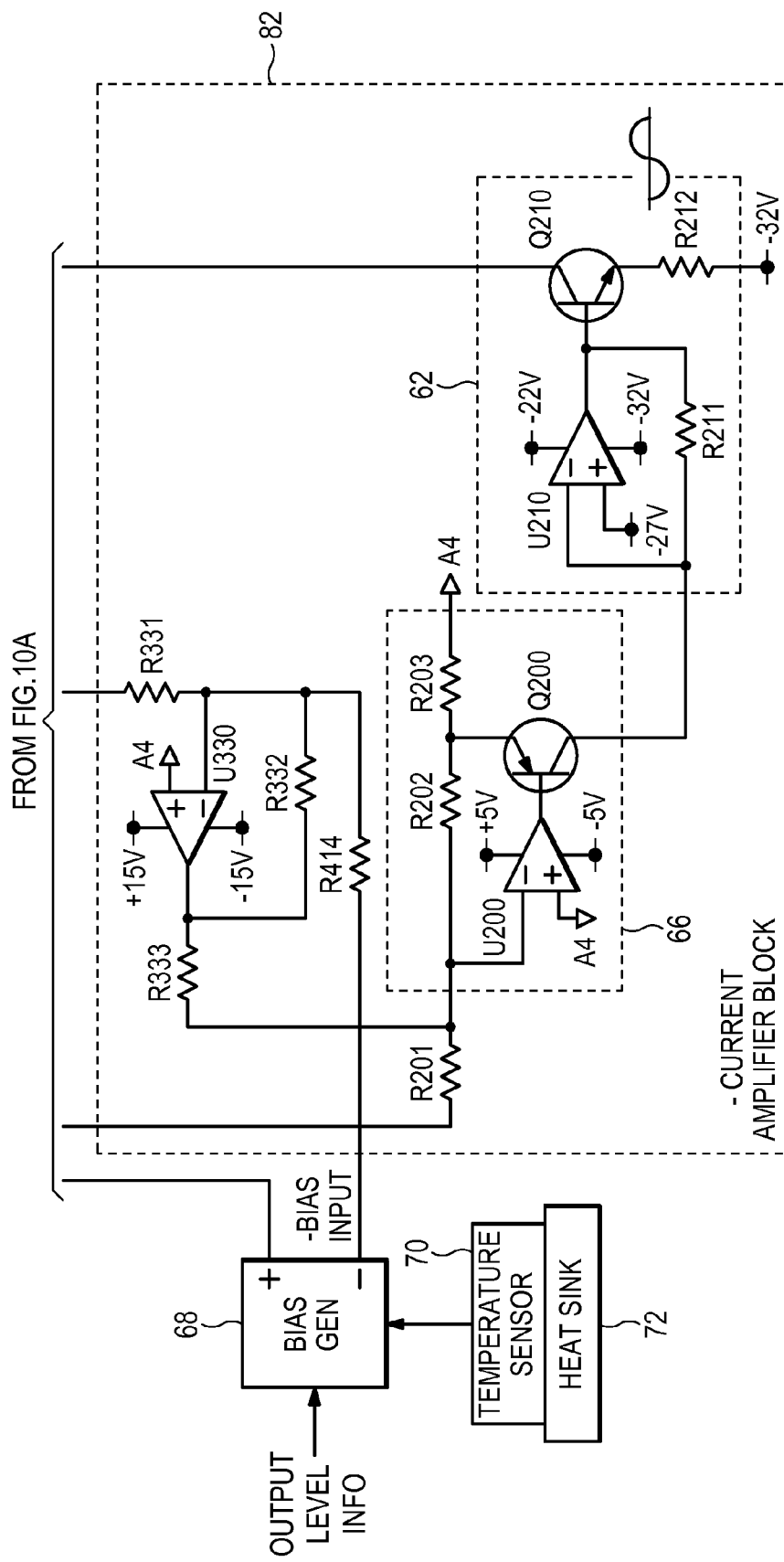
Figure 11:
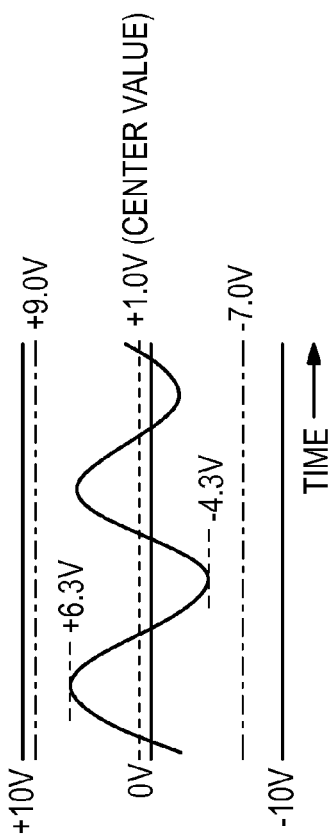
FIG. 11 shows an example of upper and lower limits of a dynamic range when positive and negative biases are changed independently each other.
Figure 12:
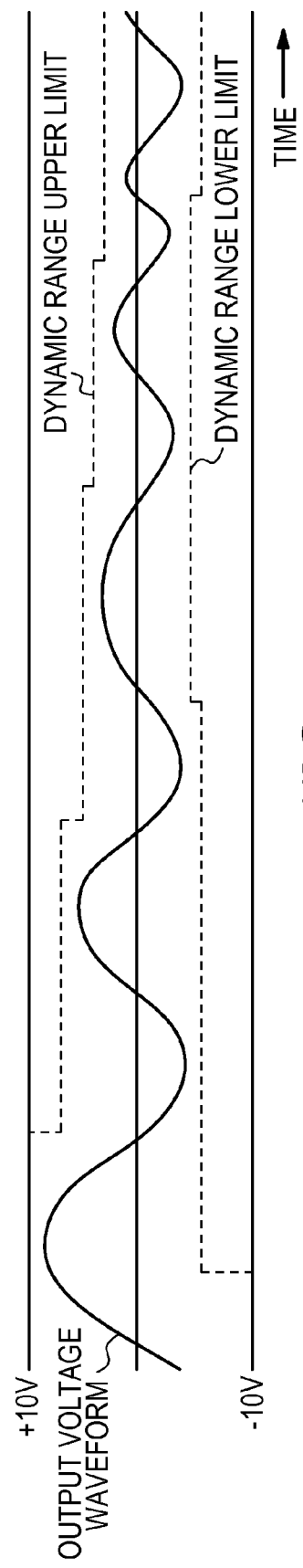
FIG. 12 is an example of a chart that changes upper and lower limits of a dynamic range according to an output voltage range.

FIGS. 10A and 10B are a block diagrams of another embodiment according to the present invention. Compared to FIGS. 5A and 5B, the bias generation circuit 68 (or actually CPU 10) receives the output voltage level information in place of the center value. The output voltage level information may be the peak to peak value of the output voltage. Using the information, the bias generation circuit 68 may independently change the positive and negative bias voltages applied to the positive and negative current sources 60 and 62 as long as the linearity of the output voltage is maintained. FIG. 11 shows an example where the upper limit of the dynamic range of the amplifier circuit is +9V and the lower limit is −7V by changing the positive and negative bias voltages independently each other. In this example, margins are provided between positive and negative peaks of the output voltage and the upper and lower limits of the dynamic range for keeping the linearity of the amplifier circuit gain. Further, as shown in FIG. 12, the positive and negative bias voltages may be dynamically changed independently as the upper and lower limits of the dynamic range change according to the range of the output voltage using known information of the level variation of the output voltage.

The present invention can reduce current levels of current sources in an amplifier circuit even during operation using known information of the output voltage level. Additionally, the amplifier circuit uses a range having the most linearity even if the center value of the output voltage is changed. Although the invention has been disclosed in terms of the preferred and alternative embodiments disclosed herein, those skilled in the art will appreciate that modifications and improvements may be made without departing from the scope of the invention.

What is claimed is:

1. An amplifier circuit for a signal generator comprising:
positive and negative current sources respectively receiving first and second current inputs and generating respective current outputs;
a first current to voltage converter for generating an output voltage from the respective current outputs provided by the positive and negative current sources;
a bias generator producing first and second bias voltages set according to a desired level for optimum dynamic range and amplifier linearity;
a second current to voltage converter coupled to receive a current representative of the first bias voltage and producing a first voltage output inverted from the first bias voltage, and a third current to voltage converter coupled to receive a current representative of the second bias voltage and producing a second voltage output inverted from the second bias voltage; and
a first voltage to current converter receiving the first inverted voltage output and an input voltage and producing a first current output representative of the first bias voltage and the input voltage, and a second voltage to current converter receiving the second inverted voltage output and the input voltage and producing a second current output representative of the second bias voltage and the input voltage;
wherein the first current output of the first voltage to current converter is provided to the positive current source as the first current input and the second current output from the second voltage to current converter is provided to the negative current source as the second current input.

2. The amplifier circuit as recited in claim 1 wherein the bias generator receives a center value offset voltage and varies the first and second bias voltages in response to the center values offset voltage to generate a corresponding center value offset voltage for the output voltage.

3. The amplifier circuit as recited in claim 1 further comprising an amplifier coupled to receive a center value offset voltage and providing a current output coupled to the second and third current to voltage converters for varying the first and second current outputs of the respective first and second voltage to current converters to generate a center value offset voltage for the output voltage corresponding to the received center value offset voltage.

4. The amplifier circuit as recited in claim 1 further comprising a fourth current to voltage converter receiving the current outputs of the positive and negative current sources and generating an error correction voltage in response to a center value offset voltage of the output voltage varying from a center value offset voltage provided to the amplifier circuit.

5. The amplifier circuit as recited in claim 1 further comprising:
 a temperature detector for the positive and negative current sources generating an output voltage in response to a detected temperature over a predetermined value and applied to the bias generator for changing the first and second bias voltages to reduce the current outputs flowing in the positive and negative current sources.

6. The amplifier circuit as recited in claim 1 wherein the bias generator dynamically changes the first and second bias voltages as a function of peak to peak voltage range of the output voltage and information of voltage level variations of the output voltage.

* * * * *